(12) United States Patent
Zhang (10) Patent No.: US 10,775,156 B2
(45) Date of Patent: Sep. 15, 2020

(54) METHOD AND DEVICE FOR AUTOMATICALLY MEASURING TRANSFER AND HANDOFF PLATFORM ON DRIVE CHIP

(71) Applicants: HKC Corporation Limited, Shenzhen, Guangdong (CN); Chongqing HKC Optoelectronics Technology Co., Ltd., Chongqing (CN)

(72) Inventor: Guanghui Zhang, Chongqing (CN)

(73) Assignees: HKC Corporation Limited, Shenzhen, Guangdong (CN); Chongqing HKC Optoelectronics Technology Co., Ltd., Jieshi Town, Chongqing (CN)

( * ) Notice: Subject to any disclaimer, the term of this patent is extended or adjusted under 35 U.S.C. 154(b) by 187 days.

(21) Appl. No.: 16/082,871

(22) PCT Filed: Aug. 16, 2017

(86) PCT No.: PCT/CN2017/097604
§ 371 (c)(1),
(2) Date: Sep. 6, 2018

(87) PCT Pub. No.: WO2018/107791
PCT Pub. Date: Jun. 21, 2018

(65) Prior Publication Data
US 2019/0078874 A1    Mar. 14, 2019

(30) Foreign Application Priority Data

Dec. 15, 2016 (CN) .......................... 2016 1 1162770

(51) Int. Cl.
*G01B 11/06* (2006.01)
*H05K 13/04* (2006.01)
(Continued)

(52) U.S. Cl.
CPC .... *G01B 11/0608* (2013.01); *H01L 21/67253* (2013.01); *H01L 21/67259* (2013.01); *H01L 21/6838* (2013.01); *H05K 13/0409* (2018.08)

(58) Field of Classification Search
CPC .......... G01B 11/0608; H01L 21/67253; H01L 21/67259; H01L 21/6838; H05K 13/0409
See application file for complete search history.

(56) References Cited

U.S. PATENT DOCUMENTS 6,948,232 B1 * 9/2005 Yazawa .............. H05K 13/0452
29/740
2016/0178363 A1 6/2016 Cyr et al.

FOREIGN PATENT DOCUMENTS

| CN | 101553705 A | 10/2009 |
| CN | 102564378 A | 7/2012 |

(Continued)

*Primary Examiner* — Hina F Ayub
(74) *Attorney, Agent, or Firm* — Muncy, Geissler, Olds & Lowe, P.C.

(57) ABSTRACT

An automatic measuring device includes a platform, a pre-positioned suction nozzle, a reverse suction nozzle, a sensor, and a reflection sheet. The sensor is fixed on a side of the reverse suction nozzle, and the reflection sheet is fixed on a side of the pre-positioned suction nozzle and is located below the sensor. The method includes the following steps: controlling, by the automatic measuring device, a light source to emit light to the reflection sheet; detecting, by the sensor, a measurement value of the reflection sheet; determining, by the automatic measuring device, a change curve of a measurement value and a height according to a material of the reflection sheet; finding, by the automatic measuring device from the change curve, a height value corresponding to the measurement value; and determining, by the automatic measuring device according to the height value, whether the transfer and handoff platform can pass examination.

20 Claims, 6 Drawing Sheets

(51) Int. Cl.
*H01L 21/67* (2006.01)
*H01L 21/683* (2006.01)

(56) References Cited

FOREIGN PATENT DOCUMENTS

| | | |
|---|---|---|
| CN | 104502828 A | 4/2015 |
| CN | 105556650 A | 5/2016 |
| CN | 105609449 A | 5/2016 |
| CN | 106767455 A | 5/2017 |

* cited by examiner

METHOD AND DEVICE FOR AUTOMATICALLY MEASURING TRANSFER AND HANDOFF PLATFORM ON DRIVE CHIP

BACKGROUND

Technical Field

This application relates to electronic chip technologies, and in particular, to a method and device for automatically measuring a transfer and handoff platform on a drive chip.

Related Art

Height detection of a transfer and handoff platform is a regular detection item of a transfer and handoff platform on an existing drive chip. When the existing drive chip (Drive IC) performs transfer, the height of a handoff platform between suction nozzles is measured by using a thickness gauge. In an existing detection manner, a detection person performs measurement by using eyes, and this is restricted by experience and skills of the detection person. Costs are high, and detection standards are not uniform, affecting a detection result.

SUMMARY

One of objectives of this application is to provide a method and device for automatically measuring a transfer and handoff platform on a drive chip, to automatically detect a height of the platform. Because there is no manual involvement, costs are low and a detection result is accurate.

One aspect of this application provides a detection method of an automatic measuring device for a transfer and handoff platform on a drive chip. The automatic measuring device comprises a platform, a pre-positioned suction nozzle, a reverse suction nozzle, a sensor, and a reflection sheet. The pre-positioned suction nozzle is placed on the platform, the reverse suction nozzle is fixedly disposed above the platform, and when the platform rotates, the pre-positioned suction nozzle is driven to move to a position directly below the reverse suction nozzle. The sensor is fixed on a side of the reverse suction nozzle, and the reflection sheet is fixed on a side of the pre-positioned suction nozzle and is located below the sensor. The method comprises the following steps:

controlling, by the automatic measuring device, a light source to emit light to the reflection sheet;

detecting, by the sensor, a measurement value of the reflection sheet;

determining, by the automatic measuring device, a change curve of a measurement value and a height according to a material of the reflection sheet;

finding, by the automatic measuring device from the change curve, a height value corresponding to the measurement value; and determining, by the automatic measuring device according to the height value, whether the transfer and handoff platform can pass examination.

Optionally, a maximum height of the reflection sheet is the same as a maximum height of the pre-positioned suction nozzle.

Optionally, the method further comprises:

if the transfer and handoff platform cannot pass examination, controlling, according to the height value, the reverse suction nozzle to move upwards or downwards until the transfer and handoff platform passes examination.

Optionally, the controlling, according to the height value, the reverse suction nozzle to move upwards or downwards until the transfer and handoff platform passes examination specifically comprises:

controlling the reverse suction nozzle to move upwards if the height value is less than a preset height value, where each time the reverse suction nozzle moves, the sensor performs measurement to obtain a first measurement value, and obtaining a first height according to the first measurement value; and stopping the movement if the first height is the same as the preset height value, or otherwise, moving upwards again and performing a height measurement step, until a height value corresponding to a measurement value obtained after a movement is the same as the preset height value.

Optionally, the controlling, according to the height value, the reverse suction nozzle to move upwards or downwards until the transfer and handoff platform passes examination specifically comprises:

controlling the reverse suction nozzle to move downwards if the height value is greater than a preset height value, where each time the reverse suction nozzle moves, the sensor performs measurement to obtain a second measurement value, and obtaining a second height according to the second measurement value; and stopping the movement if the second height is the same as the preset height value, or otherwise, moving downwards again and performing a height measurement step, until a height value corresponding to a measurement value obtained after a movement is the same as the preset height value.

Another aspect provides an automatic measuring device for a transfer and handoff platform on a drive chip. The device comprises a platform, a pre-positioned suction nozzle, and a reverse suction nozzle, and further comprises a sensor and a reflection sheet. The pre-positioned suction nozzle is placed on the platform, the reverse suction nozzle is fixedly disposed above the platform, and when the platform rotates, the pre-positioned suction nozzle is driven to move to a position directly below the reverse suction nozzle. The sensor is fixed on a side of the reverse suction nozzle, and the reflection sheet is fixed on a side of the pre-positioned suction nozzle and is located below the sensor. The device further comprises:

a processing unit, configured to control a light source to emit light to the reflection sheet;

the sensor is configured to detect a measurement value of the reflection sheet; and the processing unit is configured to: determine a change curve of a measurement value and a height according to a material of the reflection sheet; find, from the change curve, a height value corresponding to the measurement value; and determine, according to the height value, whether the transfer and handoff platform can pass examination.

Optionally, a maximum height of the reflection sheet is the same as a maximum height of the pre-positioned suction nozzle.

Optionally, the processing unit is further configured to: if the transfer and handoff platform cannot pass examination, control, according to the height value, the reverse suction nozzle to move upwards or downwards until the transfer and handoff platform passes examination.

Optionally, the processing unit is specifically configured to: control the reverse suction nozzle to move upwards if the height value is less than a preset height value, where each time the reverse suction nozzle moves, the sensor performs measurement to obtain a first measurement value, and obtain a first height according to the first measurement value; and stop the movement if the first height is the same as the preset height value, or otherwise, move upwards again and perform a height measurement step, until a height value corresponding to a measurement value obtained after a movement is the same as the preset height value.

Optionally, the processing unit is specifically configured to: control the reverse suction nozzle to move downwards if the height value is greater than a preset height value, where each time the reverse suction nozzle moves, the sensor performs measurement to obtain a second measurement value, and obtain a second height according to the second measurement value; and stop the movement if the second height is the same as the preset height value, or otherwise, move downwards again and perform a height measurement step, until a height value corresponding to a measurement value obtained after a movement is the same as the preset height value.

Still another aspect of this application provides an automatic measuring device for a transfer and handoff platform on a drive chip. The device comprises a platform, a pre-positioned suction nozzle, a reverse suction nozzle, a sensor, and a reflection sheet. The pre-positioned suction nozzle is placed on the platform, the reverse suction nozzle is fixedly disposed above the platform, and when the platform rotates, the pre-positioned suction nozzle is driven to move to a position directly below the reverse suction nozzle. The sensor is fixed on a side of the reverse suction nozzle, and the reflection sheet is fixed on a side of the pre-positioned suction nozzle and is located below the sensor. The device further comprises a processing unit, where the processing unit is configured to control a light source to emit light to the reflection sheet. The sensor is configured to detect a measurement value of the reflection sheet. The processing unit is further configured to: determine a change curve of a measurement value and a height according to a material of the reflection sheet; find, from the change curve, a height value corresponding to the measurement value; and determine, according to the height value, whether the transfer and handoff platform can pass examination. The processing unit is further configured to: control the reverse suction nozzle to move upwards if the height value is less than a preset height value, where each time the reverse suction nozzle moves, the sensor performs measurement to obtain a first measurement value, and obtain a first height according to the first measurement value; stop the movement if the first height is the same as the preset height value, or otherwise, move upwards again and perform a height measurement step, until a height value corresponding to a measurement value obtained after a movement is the same as the preset height value; control the reverse suction nozzle to move downwards if the height value is greater than a preset height value, where each time the reverse suction nozzle moves, the sensor performs measurement to obtain a second measurement value, and obtain a second height according to the second measurement value; and stop the movement if the second height is the same as the preset height value, or otherwise, move downwards again and perform a height measurement step, until a height value corresponding to a measurement value obtained after a movement is the same as the preset height value.

A person of ordinary skill in the art may understand that although the following detailed descriptions are provided with reference to the illustrated embodiments and the accompanying drawing, this application is not limited to these embodiments. Instead, the scope of this application is intended to be broad, and the scope of this application is intended to be defined only by the appended claims.

BRIEF DESCRIPTION OF THE DRAWINGS

Other features, objectives, and advantages of this application will become more apparent upon reading the following detailed descriptions of non-limiting embodiments with reference to the accompanying drawings.

FIG. 2-1 is a schematic structural diagram of a platform measuring device according to a preferred embodiment of this application;

FIG. 2-2 is a schematic structural diagram of a platform measuring device according to a preferred embodiment of this application;

FIG. 4-1 is a fit line graph of a glass reflection sheet;

FIG. 4-2 is a fit line graph of a polished copper reflection sheet; and

FIG. 4-3 is a line graph of a correlation between a height and a measurement value of a sensor.

DETAILED DESCRIPTION

Before discussing example embodiments in more detail, it should be noted that some example embodiments are described as processes or methods illustrated as flowcharts. Although in the flowcharts, operations are described as being sequentially processed, many operations thereof may be performed in parallel, concurrently, or at the same time. In addition, an order of the operations may be rearranged. When the operations are completed, the process may be terminated, and additional steps not shown in the accompanying drawings may further be included. The process may correspond to a method, a function, a procedure, a subroutine, a subprogram, or the like.

The "computer device", also referred to as a "computer", mentioned in the context refers to an intelligent electronic device that can perform a predetermined processing process such as numerical computation and/or logic computation by running a predetermined program or instruction. The computer device may include a processor and a memory. The predetermined processing process is performed by the processor by executing an instruction pre-stored in the memory, or is performed by hardware such as an ASIC, a FPGA, or a DSP, or is implemented by using a combination thereof. The computer device includes, but is not limited to, a server, a personal computer, a notebook computer, a tablet computer, a smartphone, and the like.

The methods (some are shown in the flowcharts) discussed in the following may be implemented by means of hardware, software, firmware, middleware, microcode, a hardware description language, or any combination thereof. When the software, firmware, middleware, or microcode is used for implementation, program code or a code segment used for implementing a necessary task may be stored in a machine or computer readable medium (for example, a storage medium). (One or more) processors can perform the necessary task.

Specific structures and functional details disclosed herein are merely representative, and are intended to describe the objectives of the example embodiments of this application. However, this application may be specifically implemented by using many alternatives, and should not be described as being only limited to the embodiments described herein.

It should be understood that although terms such as "first" and "second" may be used to describe various units, these units shall not be restricted by such terms. These terms are only used to distinguish one unit from another. For example, without departing from the scope of the example embodiments, a first unit may be referred to as a second unit, and similarly, a second unit may be referred to as a first unit. A term "and/or" used herein includes any one or any combination of one or more listed correlated items.

The terms used herein are only for describing specific embodiments and are not intended to limit the example embodiments. A singular form "a" or "an" includes an expression of a plural form unless otherwise clearly indicated in the context. It should also be understood that terms "include" and/or "comprise" used herein specifies the presence of the stated features, integers, steps, operations, units, and/or components, but do not exclude the presence or addition of one or more other features, integers, steps, operations, units, components, and/or combinations thereof.

It should also be noted that functions/actions mentioned in some alternative implementations may be implemented in an order different from that indicated in the accompanying drawings. For example, actually, depending on involved functions/actions, steps in two successive figures may be performed basically at the same time or sometimes may be performed in a reverse order.

The following further describes this application in detail with reference to the accompanying drawings.

Figure 1:
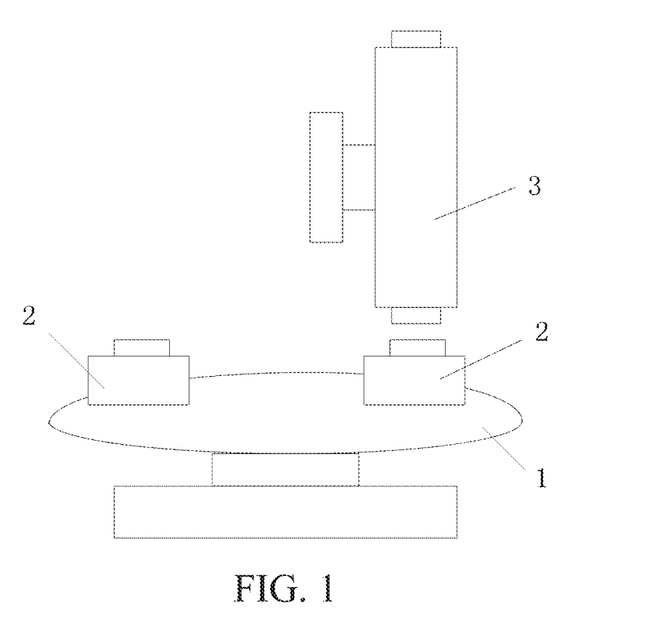
FIG. 1 is a schematic structural diagram of a platform measuring device in the related art.

As shown in FIG. 1, FIG. 1 is a schematic detection diagram of an automatic measuring device for a transfer and handoff platform on a drive chip. The device includes a platform 1, a pre-positioned suction nozzle 2, and a reverse suction nozzle 3. The pre-positioned suction nozzle 2 is placed on the platform 1, the reverse suction nozzle 3 is fixedly disposed above the platform, and when the platform 1 rotates, the pre-positioned suction nozzle 2 is driven to move to a position directly below the reverse suction nozzle 3. A wafer (a to-be-detected part) having a dimension of 20 µm passes examination and a wafer having a dimension of 30 µm cannot pass examination.

Figure 3:
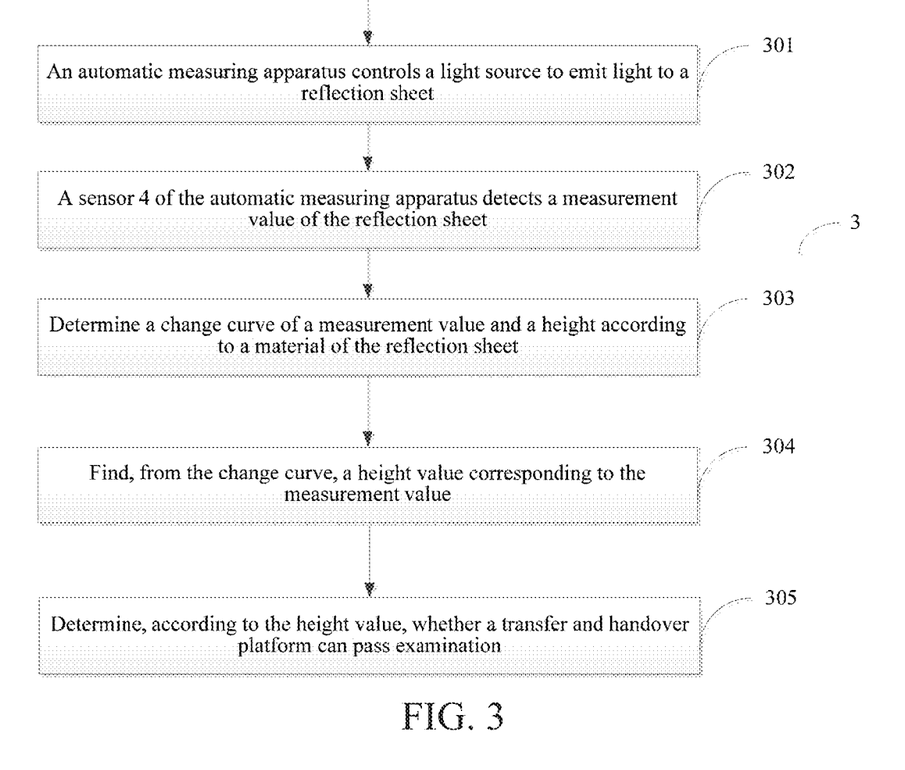
FIG. 3 is a flowchart of a detection method according to a preferred embodiment of this application.
Figure 21:
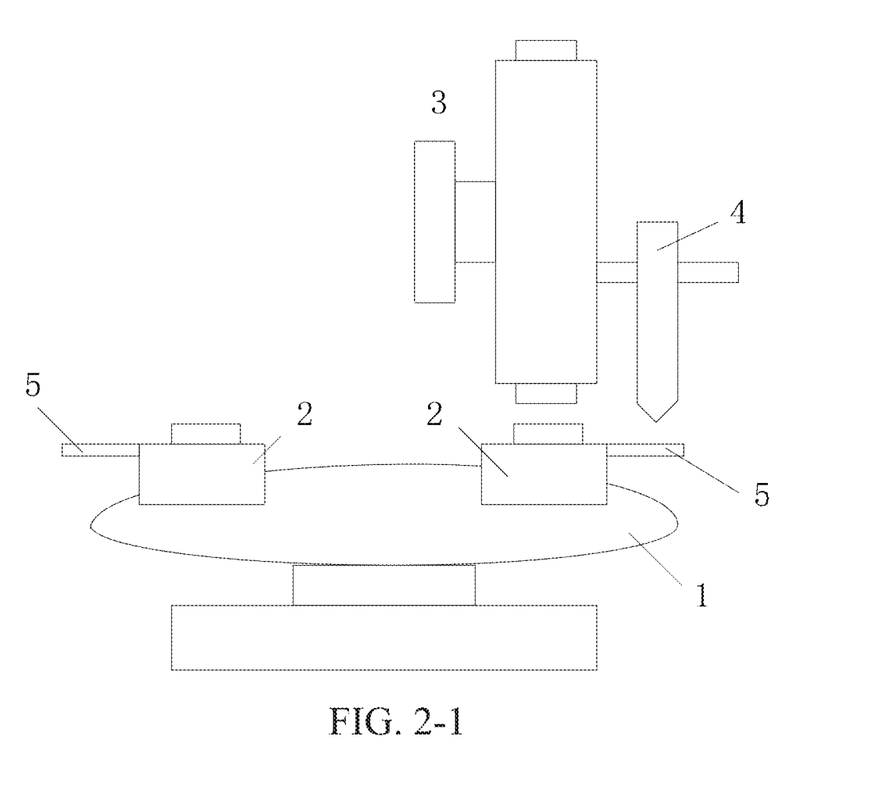
Figure 22:
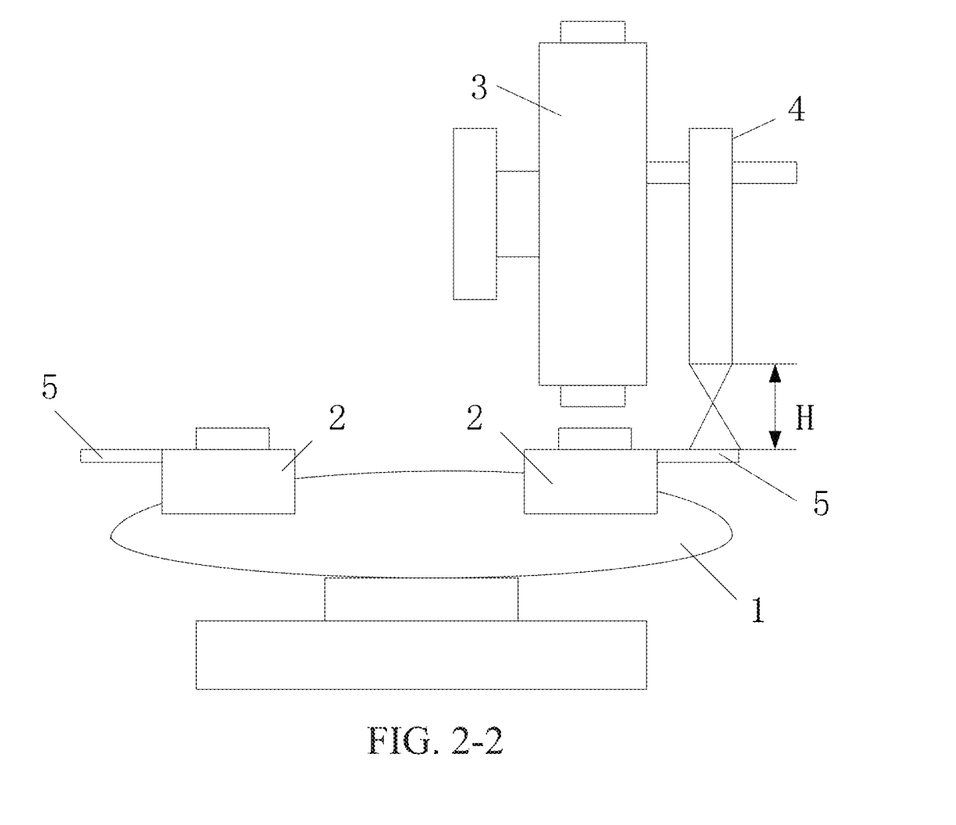

One aspect of this application provides a detection method of an automatic measuring device for a transfer and handoff platform on a drive chip. As shown in FIG. 2-1 and FIG. 2-2, the device includes a platform 1, a pre-positioned suction nozzle 2, a reverse suction nozzle 3, a sensor 4, and a reflection sheet 5. The sensor 4 is fixed on a side of the reverse suction nozzle 3, and the reflection sheet 5 is fixed on a side of the pre-positioned suction nozzle 2 and is located below the sensor 4. As shown in FIG. 3, the method includes the following steps:

Step S301: The automatic measuring device controls a light source to emit light to the reflection sheet.

Step S302: The sensor 4 of the automatic measuring device detects a measurement value of the reflection sheet.

Step S303: Determine a change curve of a measurement value and a height according to a material of the reflection sheet.

Figure 41:
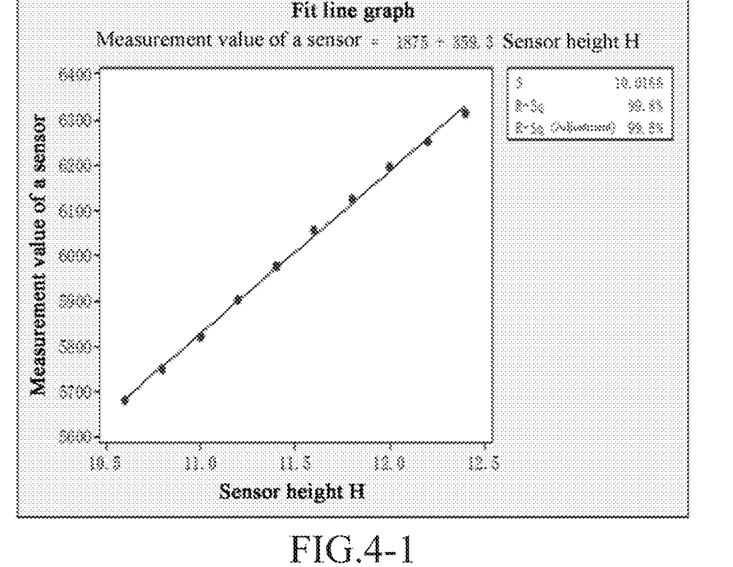
Figure 42:
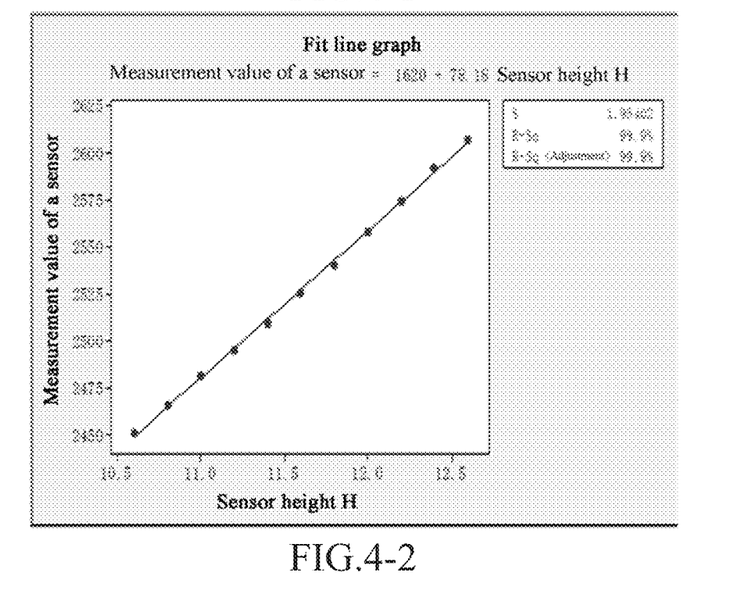
Figure 43:
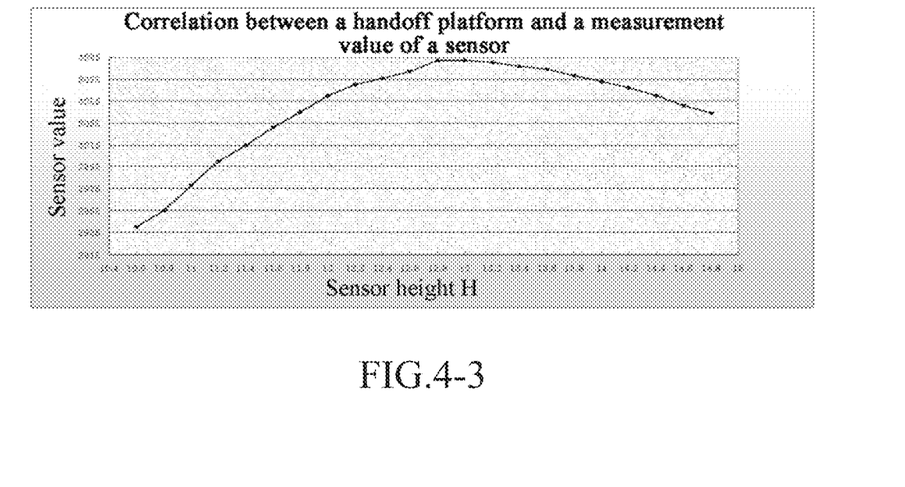

The change curve may be specifically shown in FIG. 4-1 and FIG. 4-2. FIG. 4-3 is a schematic diagram of a correlation between a height and a measurement value of a sensor.

Step S304: Find, from the change curve, a height value corresponding to the measurement value.

Step S305: Determine, according to the height value, whether the transfer and handoff platform can pass examination.

According to the device provided in this application, the sensor detects the measurement value of the reflection sheet, and the height value is directly found by using the change curve of the measurement value and the height, so that the device can automatically determine the height value without manual determining. Therefore, detection performed by the device requires no manual involvement, having low costs.

Optionally, the reflection sheet 5 is fixed on a side of the pre-positioned suction nozzle 2 and a maximum height of the reflection sheet is the same as a maximum height of the pre-positioned suction nozzle 2, that is, the reflection sheet 5 is flush with the pre-positioned suction nozzle 2. This design is for allowing the height value to be equal to the height of a handoff platform between suction nozzles, thereby avoiding conversion between height values and facilitating computation.

Optionally, after step 305, the method may further include:

if the transfer and handoff platform cannot pass examination, controlling, according to the height value, the reverse suction nozzle 3 to move upwards or downwards until the transfer and handoff platform passes examination.

The reverse suction nozzle 3 may be controlled to move upwards or downwards in a plurality of manners. For example, in a specific embodiment of this application, a servomotor may drive the reverse suction nozzle to move upwards or downwards. Certainly, in another specific embodiment of this application, a stepper motor may drive the reverse suction nozzle to move upwards or downwards. A specific control manner is not limited in a specific implementation of this application.

The controlling, according to the height value, the reverse suction nozzle 3 to move upwards or downwards until the transfer and handoff platform passes examination may specifically include:

controlling the reverse suction nozzle 3 to move upwards if the height value is less than a preset height value, where each time the reverse suction nozzle 3 moves, the sensor performs measurement to obtain a first measurement value, and obtaining a first height according to the first measurement value; and stopping the movement if the first height is the same as the preset height value, or otherwise, moving upwards again and performing a height measurement step, until a height value corresponding to a measurement value obtained after a movement is the same as the preset height value; or controlling the reverse suction nozzle 3 to move downwards if the height value is greater than a preset height value, where each time the reverse suction nozzle 3 moves, the sensor performs measurement to obtain a second measurement value, and obtaining a second height according to the second measurement value; and stopping the movement if the second height is the same as the preset height value, or otherwise, moving downwards again and performing a height measurement step, until a height value corresponding to a measurement value obtained after a movement is the same as the preset height value.

Another aspect of this application provides an automatic measuring device for a transfer and handoff platform on a drive chip. A hardware structure of the device is shown in FIG. 2-1 and FIG. 2-2, and the device includes a platform 1, a pre-positioned suction nozzle 2, a reverse suction nozzle 3, a sensor 4, and a reflection sheet 5. The sensor 4 is fixed on a side of the reverse suction nozzle 3, and the reflection sheet 5 is fixed on a side of the pre-positioned suction nozzle 2 and is located below the sensor 4. The device further includes:

a processing unit, configured to control a light source to emit light to the reflection sheet.

The sensor 4 is configured to detect a measurement value of the reflection sheet.

The processing unit is configured to: determine a change curve of a measurement value and a height according to a material of the reflection sheet; find, from the change curve, a height value corresponding to the measurement value; and determine, according to the height value, whether the transfer and handoff platform can pass examination.

According to the method provided in this application, the sensor detects the measurement value of the reflection sheet, and the height value is directly found by using the change curve of the measurement value and the height, so that the device can automatically determine the height value without manual determining. Therefore, detection performed by the device requires no manual involvement, having low costs.

Optionally, the reflection sheet 5 is fixed on a side of the pre-positioned suction nozzle 2 and a maximum height of the reflection sheet is the same as a maximum height of the pre-positioned suction nozzle 2, that is, the reflection sheet 5 is flush with the pre-positioned suction nozzle 2. This design is for allowing the height value to be equal to the height of a handoff platform between suction nozzles, thereby avoiding conversion between height values and facilitating computation.

Optionally, the processing unit is further configured to: if the transfer and handoff platform cannot pass examination, control, according to the height value, the reverse suction nozzle 3 to move upwards or downwards until the transfer and handoff platform passes examination.

The reverse suction nozzle 3 may be controlled to move upwards or downwards in a plurality of manners. For example, in a specific embodiment of this application, a servomotor may drive the reverse suction nozzle to move upwards or downwards. Certainly, in another specific embodiment of this application, a stepper motor may drive the reverse suction nozzle to move upwards or downwards. A specific control manner is not limited in a specific implementation of this application.

The processing unit is specifically configured to: control the reverse suction nozzle 3 to move upwards if the height value is less than a preset height value, where each time the reverse suction nozzle 3 moves, the sensor performs measurement to obtain a first measurement value, and obtain a first height according to the first measurement value; and stop the movement if the first height is the same as the preset height value, or otherwise, move upwards again and perform a height measurement step, until a height value corresponding to a measurement value obtained after a movement is the same as the preset height value.

The processing unit is further specifically configured to: control the reverse suction nozzle 3 to move downwards if the height value is greater than a preset height value, where each time the reverse suction nozzle 3 moves, the sensor performs measurement to obtain a second measurement value, and obtain a second height according to the second measurement value; and stop the movement if the second height is the same as the preset height value, or otherwise, move downwards again and perform a height measurement step, until a height value corresponding to a measurement value obtained after a movement is the same as the preset height value.

For a person skilled in the art, it is obvious that this application is not limited to the details of the foregoing example embodiments, and this application can be implemented in other specific forms without departing from the spirit or basic features of this application. In all aspects, these embodiments should be considered as exemplary rather than limitative. The scope of this application is defined by the appended claims rather than the foregoing specification. Therefore, meanings of elements equivalent to those in the claims and all changes falling within the scope of the claims should be encompassed within the scope of this application, and any reference numeral in the claims shall not be construed as limiting the involved claims. In addition, apparently, the word "include" does not exclude other units or steps, and a singular form does not exclude a plural form. A plurality of units or devices stated in the system claims may also be implemented by one unit or device by means of software or hardware. Words such as "first" and "second" are used to represent names, and are not intended to represent any particular order.

What is claimed is:

1. A detection method of an automatic measuring device for a transfer and handoff platform on a drive chip, wherein the automatic measuring device comprises: a platform, a pre-positioned suction nozzle, a reverse suction nozzle, a sensor, and a reflection sheet, wherein
   the pre-positioned suction nozzle is placed on the platform, the reverse suction nozzle is fixedly disposed above the platform, and when the platform rotates, the pre-positioned suction nozzle is driven to move to a position directly below the reverse suction nozzle; the sensor is fixed on a side of the reverse suction nozzle, and the reflection sheet is fixed on a side of the pre-positioned suction nozzle and is located below the sensor; and the method comprises the following steps:
   controlling, by the automatic measuring device, a light source to emit light to the reflection sheet;
   detecting, by the sensor, a measurement value of the reflection sheet;
   determining, by the automatic measuring device, a change curve of the measurement value and a height according to a material of the reflection sheet;
   finding, by the automatic measuring device from the change curve, a height value corresponding to the measurement value; and
   determining, by the automatic measuring device according to the height value, whether the transfer and handoff platform can pass examination.

2. The detection method of an automatic measuring device for a transfer and handoff platform on a drive chip according to claim 1, wherein a maximum height of the reflection sheet is the same as a maximum height of the pre-positioned suction nozzle.

3. The detection method of an automatic measuring device for a transfer and handoff platform on a drive chip according to claim 1, wherein the method further comprises: if the transfer and handoff platform cannot pass examination, controlling, according to the height value, the reverse suction nozzle to move upwards until the transfer and handoff platform passes examination.

4. The detection method of an automatic measuring device for a transfer and handoff platform on a drive chip according to claim 3, wherein the controlling, according to the height value, the reverse suction nozzle to move upwards until the transfer and handoff platform passes examination specifically comprises:
   controlling the reverse suction nozzle to move upwards if the height value is less than a preset height value, wherein each time the reverse suction nozzle moves, the sensor performs measurement to obtain a first measurement value, and obtaining a first height according to the first measurement value.

5. The detection method of an automatic measuring device for a transfer and handoff platform on a drive chip according to claim 4, wherein the reverse suction nozzle stops moving if the first height is the same as the preset height value.

6. The detection method of an automatic measuring device for a transfer and handoff platform on a drive chip according to claim 4, wherein if the first height is different from the preset height value, the reverse suction nozzle moves upwards again and a height measurement step is performed, until a height value corresponding to a measurement value obtained after a movement is the same as the preset height value.

7. The detection method of an automatic measuring device for a transfer and handoff platform on a drive chip according to claim 1, wherein the method further comprises: if the transfer and handoff platform cannot pass examination, controlling, according to the height value, the reverse suction nozzle to move downwards until the transfer and handoff platform passes examination.

8. The detection method of an automatic measuring device for a transfer and handoff platform on a drive chip according to claim 7, wherein the controlling, according to the height value, the reverse suction nozzle to move downwards until the transfer and handoff platform passes examination specifically comprises:
controlling the reverse suction nozzle to move downwards if the height value is greater than a preset height value, wherein each time the reverse suction nozzle moves, the sensor performs measurement to obtain a second measurement value, and obtaining a second height according to the second measurement value.

9. The detection method of an automatic measuring device for a transfer and handoff platform on a drive chip according to claim 8, wherein the reverse suction nozzle stops moving if the second height is the same as the preset height value.

10. The detection method of an automatic measuring device for a transfer and handoff platform on a drive chip according to claim 8, wherein if the second height is different from the preset height value, the reverse suction nozzle moves downwards again and a height measurement step is performed, until a height value corresponding to a measurement value obtained after a movement is the same as the preset height value.

11. An automatic measuring device for a transfer and handoff platform on a drive chip, wherein the device comprises: a platform, a pre-positioned suction nozzle, a reverse suction nozzle, a sensor, and a reflection sheet, wherein
the pre-positioned suction nozzle is placed on the platform, the reverse suction nozzle is fixedly disposed above the platform, and when the platform rotates, the pre-positioned suction nozzle is driven to move to a position directly below the reverse suction nozzle; the sensor is fixed on a side of the reverse suction nozzle, and the reflection sheet is fixed on a side of the pre-positioned suction nozzle and is located below the sensor; and the device further comprises:
a processing unit, wherein the processing unit is configured to control a light source to emit light to the reflection sheet;
the sensor is configured to detect a measurement value of the reflection sheet; and
the processing unit is further configured to: determine a change curve of the measurement value and a height according to a material of the reflection sheet; find, from the change curve, a height value corresponding to the measurement value; and determine, according to the height value, whether the transfer and handoff platform can pass examination.

12. The automatic measuring device for a transfer and handoff platform on a drive chip according to claim 11, wherein a maximum height of the reflection sheet is the same as a maximum height of the pre-positioned suction nozzle.

13. The automatic measuring device for a transfer and handoff platform on a drive chip according to claim 11, wherein the processing unit is further configured to: if the transfer and handoff platform cannot pass examination, control, according to the height value, the reverse suction nozzle to move upwards or downwards until the transfer and handoff platform passes examination.

14. The automatic measuring device for a transfer and handoff platform on a drive chip according to claim 13, wherein the processing unit is specifically configured to: control the reverse suction nozzle to move upwards if the height value is less than a preset height value, wherein each time the reverse suction nozzle moves, the sensor performs measurement to obtain a first measurement value, and obtain a first height according to the first measurement value.

15. The automatic measuring device for a transfer and handoff platform on a drive chip according to claim 14, wherein the processing unit is specifically configured to stop the movement if the first height is the same as the preset height value.

16. The automatic measuring device for a transfer and handoff platform on a drive chip according to claim 14, wherein the processing unit is specifically configured to: if the first height is different from the preset height value, move upwards again and perform a height measurement step, until a height value corresponding to a measurement value obtained after a movement is the same as the preset height value.

17. The automatic measuring device for a transfer and handoff platform on a drive chip according to claim 13, wherein the processing unit is specifically configured to: control the reverse suction nozzle to move downwards if the height value is greater than a preset height value, wherein each time the reverse suction nozzle moves, the sensor performs measurement to obtain a second measurement value, and obtain a second height according to the second measurement value.

18. The automatic measuring device for a transfer and handoff platform on a drive chip according to claim 17, wherein the processing unit is specifically configured to stop the movement if the second height is the same as the preset height value.

19. The automatic measuring device for a transfer and handoff platform on a drive chip according to claim 17, wherein the processing unit is specifically configured to: if the second height is different from the preset height value, move downwards again and perform a height measurement step, until a height value corresponding to a measurement value obtained after a movement is the same as the preset height value.

20. An automatic measuring device for a transfer and handoff platform on a drive chip, wherein the device comprises: a platform, a pre-positioned suction nozzle, a reverse suction nozzle, a sensor, and a reflection sheet, wherein
the pre-positioned suction nozzle is placed on the platform, the reverse suction nozzle is fixedly disposed above the platform, and when the platform rotates, the pre-positioned suction nozzle is driven to move to a position directly below the reverse suction nozzle; the sensor is fixed on a side of the reverse suction nozzle, and the reflection sheet is fixed on a side of the pre-positioned suction nozzle and is located below the sensor; and the device further comprises:

a processing unit, wherein the processing unit is configured to control a light source to emit light to the reflection sheet;

the sensor is configured to detect a measurement value of the reflection sheet;

the processing unit is further configured to: determine a change curve of the measurement value and a height according to a material of the reflection sheet; find, from the change curve, a height value corresponding to the measurement value, and determine, according to the height value, whether the transfer and handoff platform can pass examination; and the processing unit is further configured to: control the reverse suction nozzle to move upwards if the height value is less than a preset height value, wherein each time the reverse suction nozzle moves, the sensor performs measurement to obtain a first measurement value, and obtain a first height according to the first measurement value; stop the movement if the first height is the same as the preset height value, or otherwise, move upwards again and perform a height measurement step, until a height value corresponding to a measurement value obtained after a movement is the same as the preset height value; control the reverse suction nozzle to move downwards if the height value is greater than a preset height value, wherein each time the reverse suction nozzle moves, the sensor performs measurement to obtain a second measurement value, and obtain a second height according to the second measurement value; and stop the movement if the second height is the same as the preset height value, or otherwise, move downwards again and perform a height measurement step, until a height value corresponding to a measurement value obtained after a movement is the same as the preset height value.

* * * * *